(12) United States Patent
Andrews et al.

(10) Patent No.: US 7,586,325 B1
(45) Date of Patent: Sep. 8, 2009

(54) INTEGRATED CIRCUIT HAVING INDEPENDENT VOLTAGE AND PROCESS/TEMPERATURE CONTROL

(75) Inventors: William B. Andrews, Emmaus, PA (US); Mou C. Lin, High Bridge, NJ (US); John Schadt, Bethlehem, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/949,130

(22) Filed: Dec. 3, 2007

(51) Int. Cl.
*H03K 17/16* (2006.01)
*H03K 19/003* (2006.01)

(52) U.S. Cl. .......................... 326/32; 327/109; 326/30; 326/86; 326/87

(58) Field of Classification Search ............. 326/30–32, 326/82–83, 86–87; 327/108–109
See application file for complete search history.

(56) References Cited

U.S. PATENT DOCUMENTS

| | | | | |
|---|---|---|---|---|
| 5,495,184 A * | 2/1996 | Des Rosiers et al. | ......... | 326/73 |
| 6,118,310 A * | 9/2000 | Esch, Jr. | .................... | 327/108 |
| 6,448,815 B1 * | 9/2002 | Talbot et al. | .................. | 326/86 |
| 6,509,757 B1 * | 1/2003 | Humphrey | .................. | 326/30 |
| 6,642,742 B1 * | 11/2003 | Loyer | ......................... | 326/30 |
| 6,654,310 B2 * | 11/2003 | Nam | ...................... | 365/230.06 |
| 6,717,451 B1 | 4/2004 | Klein et al. | ................. | 327/333 |
| 6,980,020 B2 * | 12/2005 | Best et al. | ..................... | 326/30 |
| 7,285,977 B2 * | 10/2007 | Kim | ............................. | 326/30 |
| 7,459,930 B2 * | 12/2008 | Mei | ............................. | 326/30 |
| 2008/0048714 A1 * | 2/2008 | Lee et al. | ...................... | 326/30 |

OTHER PUBLICATIONS

Xilinx, "*Virtex-II Platform FPGAs: Functional Description*," Production Specification DS031-2 (v3.4) Mar. 1, 2005; Module 2 of 4, p. 8.

* cited by examiner

*Primary Examiner*—Vibol Tan
*Assistant Examiner*—Jason Crawford
(74) *Attorney, Agent, or Firm*—Mendelsohn, Drucker & Associates, P.C.

(57) ABSTRACT

In one embodiment, an integrated circuit has configurable application circuitry that operates at any one of multiple available power supply voltages. PT-control circuitry, operating at a PT reference voltage, generates a PT-control signal indicative of variations in process and temperature. Application-control circuitry controls the configuration of the application circuitry based on the selected power supply voltage for the application circuitry and the PT-control signal, where the selected power supply voltage is independent of the PT reference voltage. In one implementation, the application circuitry is an output driver having source and sink driver blocks, where driver-control circuitry controls the configuration of the source driver block based on the selected output-driver power supply voltage, a source PT-control signal, and a selected drive strength, while controlling the configuration of the sink driver block based on the selected output-driver power supply voltage, a sink PT-control signal, and a selected drive strength.

12 Claims, 8 Drawing Sheets

Table 1: Output Buffer Source and Sink Size Combinations

| Source | | | | | | Sink | | | | | |
|---|---|---|---|---|---|---|---|---|---|---|---|
| Section 1 | Section 2 | Section 3 | Section 4 | Section 5 | | Section 1 | Section 2 | Section 3 | Section 4 | Section 5 | |
| 40um | 60um | 120um | 240um | 480um | Total (um) | 10um | 20um | 30um | 60um | 120um | Total (um) |
| 0 | 0 | 0 | 0 | 0 | 0 | 0 | 0 | 0 | 0 | 0 | 0 |
| 1 | 0 | 0 | 0 | 0 | 40 | 1 | 0 | 0 | 0 | 0 | 10 |
| 0 | 1 | 0 | 0 | 0 | 60 | 0 | 1 | 0 | 0 | 0 | 20 |
| 1 | 1 | 0 | 0 | 0 | 100 | 1 | 1 | 0 | 0 | 0 | 30 |
| 0 | 0 | 1 | 0 | 0 | 120 | 0 | 0 | 1 | 0 | 0 | 30 |
| 1 | 0 | 1 | 0 | 0 | 160 | 1 | 0 | 1 | 0 | 0 | 40 |
| 0 | 1 | 1 | 0 | 0 | 180 | 0 | 1 | 1 | 0 | 0 | 50 |
| 1 | 1 | 1 | 0 | 0 | 220 | 1 | 1 | 1 | 0 | 0 | 60 |
| 0 | 0 | 0 | 1 | 0 | 240 | 0 | 0 | 0 | 1 | 0 | 60 |
| 1 | 0 | 0 | 1 | 0 | 280 | 1 | 0 | 0 | 1 | 0 | 70 |
| 0 | 1 | 0 | 1 | 0 | 300 | 0 | 1 | 0 | 1 | 0 | 80 |
| 1 | 1 | 0 | 1 | 0 | 340 | 1 | 1 | 0 | 1 | 0 | 90 |
| 0 | 0 | 1 | 1 | 0 | 360 | 0 | 0 | 1 | 1 | 0 | 90 |
| 1 | 0 | 1 | 1 | 0 | 400 | 1 | 0 | 1 | 1 | 0 | 100 |
| 0 | 1 | 1 | 1 | 0 | 420 | 0 | 1 | 1 | 1 | 0 | 110 |
| 1 | 1 | 1 | 1 | 0 | 460 | 1 | 1 | 1 | 1 | 0 | 120 |
| 0 | 0 | 0 | 0 | 1 | 480 | 0 | 0 | 0 | 0 | 1 | 120 |
| 1 | 0 | 0 | 0 | 1 | 520 | 1 | 0 | 0 | 0 | 1 | 130 |
| 0 | 1 | 0 | 0 | 1 | 540 | 0 | 1 | 0 | 0 | 1 | 140 |
| 1 | 1 | 0 | 0 | 1 | 580 | 1 | 1 | 0 | 0 | 1 | 150 |
| 0 | 0 | 1 | 0 | 1 | 600 | 0 | 0 | 1 | 0 | 1 | 150 |
| 1 | 0 | 1 | 0 | 1 | 640 | 1 | 0 | 1 | 0 | 1 | 160 |
| 0 | 1 | 1 | 0 | 1 | 660 | 0 | 1 | 1 | 0 | 1 | 170 |
| 1 | 1 | 1 | 0 | 1 | 700 | 1 | 1 | 1 | 0 | 1 | 180 |
| 0 | 0 | 0 | 1 | 1 | 720 | 0 | 0 | 0 | 1 | 1 | 180 |
| 1 | 0 | 0 | 1 | 1 | 760 | 1 | 0 | 0 | 1 | 1 | 190 |
| 0 | 1 | 0 | 1 | 1 | 780 | 0 | 1 | 0 | 1 | 1 | 200 |
| 1 | 1 | 0 | 1 | 1 | 820 | 1 | 1 | 0 | 1 | 1 | 210 |
| 0 | 0 | 1 | 1 | 1 | 840 | 0 | 0 | 1 | 1 | 1 | 210 |
| 1 | 0 | 1 | 1 | 1 | 880 | 1 | 0 | 1 | 1 | 1 | 220 |
| 0 | 1 | 1 | 1 | 1 | 900 | 0 | 1 | 1 | 1 | 1 | 230 |
| 1 | 1 | 1 | 1 | 1 | 940 | 1 | 1 | 1 | 1 | 1 | 240 |

FIG. 3

INTEGRATED CIRCUIT HAVING INDEPENDENT VOLTAGE AND PROCESS/TEMPERATURE CONTROL

TECHNICAL FIELD

The present invention relates to integrated circuits, such as field-programmable gate arrays (FPGAs), and, in particular, to compensation schemes for process, voltage, and temperature (PVT) variations in such integrated circuits.

BACKGROUND

The number of input/output (I/O) standards keeps increasing with more power supplies, signaling levels, and drive strengths. Programmable devices need to support as many of these standards as possible with as little utilization of resources as possible in order to keep costs down and maintain a competitive advantage in the ever-changing marketplace. Ideally, a single programmable device can support multiple drive types at the same time at different I/O positions around the device.

PVT control refers to the ability of an integrated circuit (IC) to adjust one or more of its operating characteristics to compensate for process variations from chip to chip of a single IC design and for voltage and temperature variations over time within a single chip. Typical PVT control involves implementing special PVT-control circuitry within each chip that reacts to PVT variations within the PVT-control circuitry in order to generate control signals that adjust operations of other circuitry on the chip, with the assumption that the PVT variations in that other circuitry are the same as those that affect the PVT-control circuitry.

FIG. 1 shows a block diagram of a portion of a conventional integrated circuit 100 having a programmable output driver 102 whose operations are controlled, in part, by a PVT-control circuit 104. In this exemplary device, programmable output driver 102 is a push pull output buffer having (i) a source driver block 110 connected between a power supply VCCIO and an output pad 106 and (ii) a sink driver block 120 connected between output pad 106 and the ground potential. Source block 110 has a set of identical switched source sections 112 connected in parallel. Similarly, sink block 120 has a set of identical switched sink sections 122 connected in parallel. The term "switched" implies that the corresponding source/sink section can be selectively turned on or off.

Each source section 112 itself has a set of switched PFET resistors (not shown in FIG. 1) of different resistance levels connected in parallel. Similarly, each sink section 122 itself has a set of switched NFET resistors (not shown in FIG. 1) of different resistance levels connected in parallel.

In general, the PFETs in the source sections are much more sensitive to the power supply potential than are the NFETs in the sink sections. As the power supply voltage changes, the ratio between the effective PFET-based source block size and the effective NFET-based sink block size needs to be adjusted to maintain desired signaling characteristics of output driver 102.

PVT-control circuit 104 has (i) a source-control section 130 that is identical to each source section 112 in source block 110 of output driver 102 and (ii) a sink-control section 150 that is identical to each sink section 122 in sink block 120 of output driver 102.

In a typical implementation, PVT-control circuit 104 controls the configuration of each source section 112 and each sink section 122. In particular, based on the operating characteristics of source-control section 130, PVT-control circuit 104 determines and controls which resistors in each source section 112 are switched on to achieve an identical impedance level for all of the source sections 112. Similarly, based on the operating characteristics of sink-control section 150, PVT-control circuit 104 determines and controls which resistors in each sink section 122 are switched on to achieve an identical impedance level for all of the sink sections 122. In the particular implementation shown in FIG. 1, PVT-control circuit 104 configures (i.e., turns on or off) the switched resistors within each source section 112 and each sink section 122 such that all source/sink sections provide approximately the same resistance level (i.e., the same drive strength), e.g., nominally 100 ohms, under all PVT conditions.

The user of integrated circuit 100 controls the configuration of source block 110 to select which source sections 112 are switched on to achieve a desired source impedance level for a particular output driver application. Similarly, the user controls the configuration of sink block 120 to select which sink sections 122 are switched on to achieve a desired sink impedance level for that output driver application. The desired source and sink impedance levels correspond to a selected drive strength of the output driver application.

In the conventional embodiment of FIG. 1, PVT control of the source/sink sections is independent of the output driver application, and the configuration of source/sink sections for an output driver application is independent of the current PVT conditions.

For an exemplary implementation, in which each of source block 110 and sink block 120 has N identical sections, there are a maximum of (N+1) different impedance levels that can be made available to a user for each block (i.e., a first configuration in which all sections are off, a second configuration in which all but one of the sections are off, up to an (N+1)th configuration in which all sections are on). Since the selection of which resistors in each source/sink section are switched on is controlled by the PVT-control circuit 104, additional impedance levels based on configuring the resistors within individual source/sink sections cannot be made available to the user.

Furthermore, in a conventional programmable IC device that supports different I/O standards at the same time at different I/O positions around the device, each different I/O position around the device would be implemented with its own dedicated PVT-control circuitry. Moreover, in conventional implementation of IC 100 of FIG. 1, the power supply voltage selected for output driver 102 would also be used to drive PVT-control circuitry 104.

SUMMARY

In one embodiment, the present invention is an integrated circuit comprising configurable application circuitry, PT-control circuitry, and application-control circuitry. The configurable application circuitry operates at any selected power supply voltage of a plurality of available power supply voltages. The PT-control circuitry generates a PT-control signal indicative of variations in at least one of process and temperature, wherein the PT-control circuitry operates at a PT reference voltage. The application-control circuitry controls the configuration of the application circuitry based on the selected power supply voltage for the application circuitry and the PT-control signal, wherein the selected power supply voltage for the application circuitry is independent of the PT reference voltage.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 3 shows a table identifying the different possible effective block sizes for different configurations of each of source and sink block, for the particular output-driver implementation depicted in FIG. 2;

DETAILED DESCRIPTION

Figure 2:
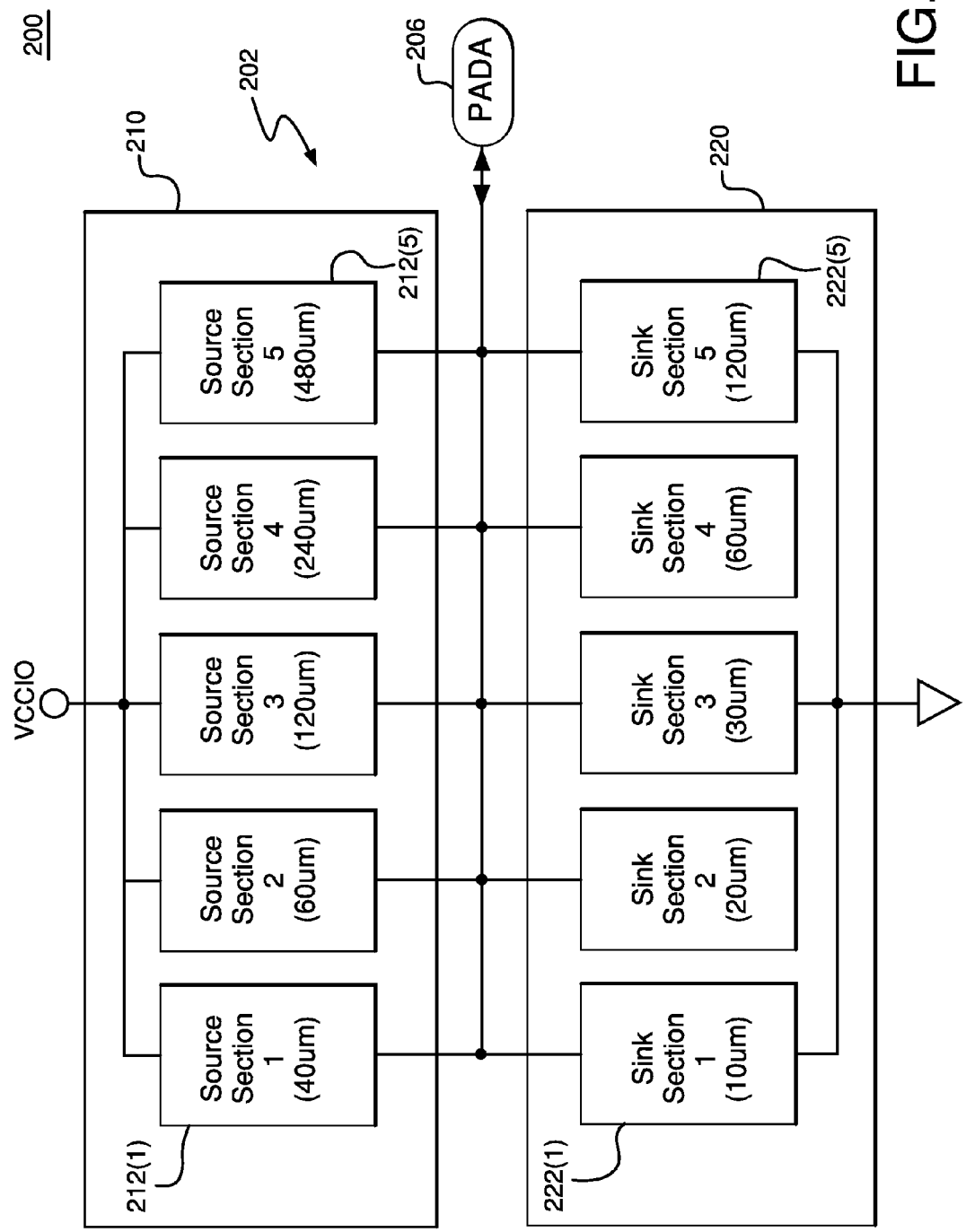
FIG. 2 shows a block diagram of a portion of an integrated circuit having a programmable output driver, according to one embodiment of the present invention.

FIG. 2 shows a block diagram of a portion of an integrated circuit 200 having a programmable output driver 202, according to one embodiment of the present invention. In this exemplary device, programmable output driver 202 has (i) a source driver block 210 connected between a power supply VCCIO and an output pad 206 and (ii) a sink driver block 220 connected between output pad 206 and ground. Source block 210 has a set of five non-identical switched source sections 212(1)-212(5) connected in parallel. Similarly, sink block 220 has a set of five non-identical switched sink sections 222(1)-222(5) connected in parallel.

The particular sizes (e.g., channel widths) of the various source and sink sections are identified in FIG. 2. In different implementations of output driver 202, the number of sections in the source and sink blocks can be other than five, the number of sections in the source block can be different from the number of section in the sink block, and/or those sections can have different distributions of device sizes. Note that, because of operational differences between PFETs and NFETs, similar drive characteristics are achieved using PFET devices that are larger than the NFET devices. For example, in the implementation of FIG. 2, the drive characteristics of 40-micron PFET-based source section 212(1) are similar to those of 10-micron NFET-based sink section 222(1) at a particular PVT condition for a specific technology.

FIG. 3 shows a table identifying the different possible effective block sizes for different configurations of each of source block 210 and sink block 220, for the particular output-driver implementation depicted in FIG. 2, where a "0" indicates that the corresponding source/sink section is switched off (i.e., does not contribute to the effective block size for that particular configuration of source/sink sections) and a "1" indicates that the corresponding source/sink section is switched on (i.e., does contribute to the effective block size).

Figure 1:
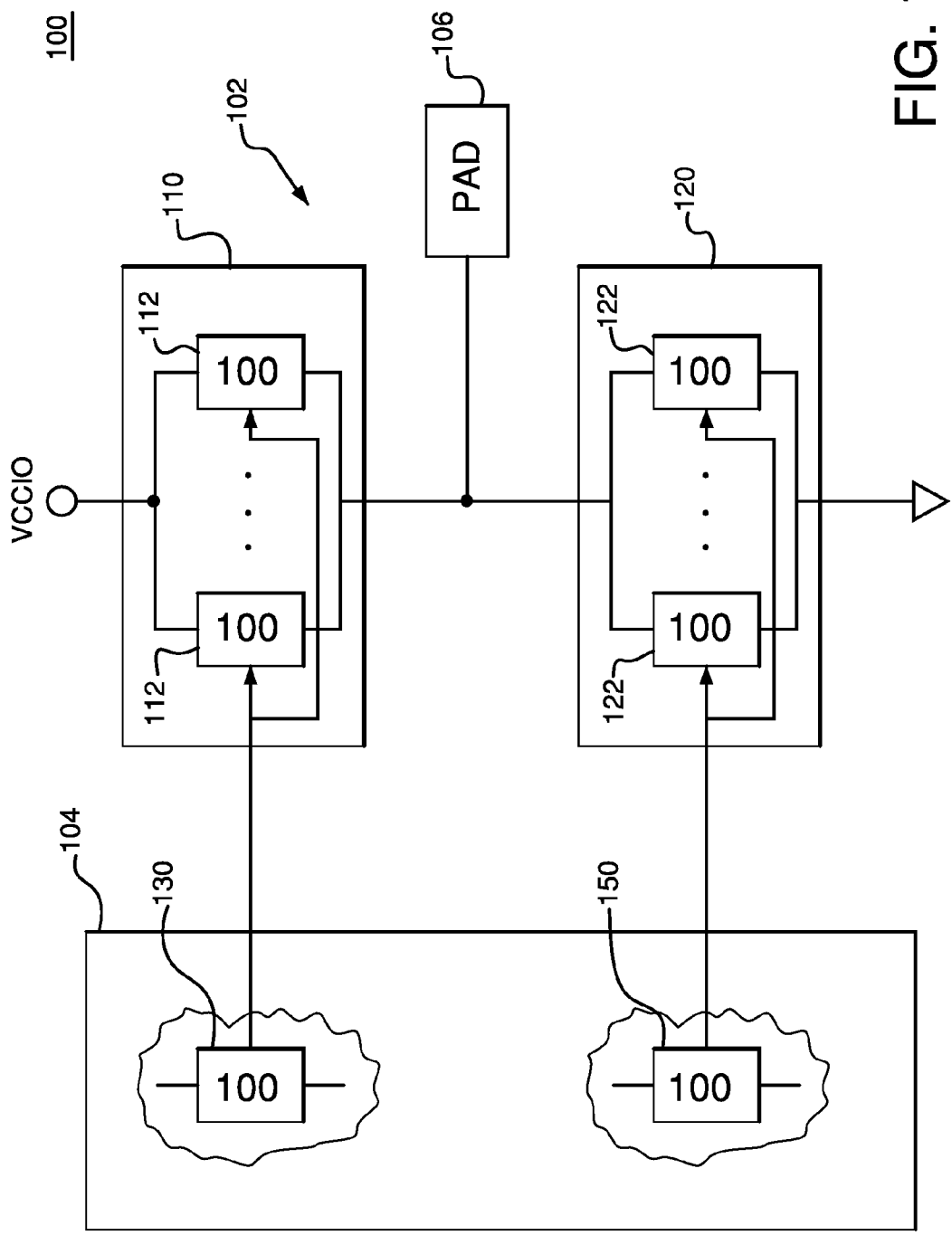
FIG. 1 shows a block diagram of a portion of a conventional integrated circuit having a programmable output driver whose operations are controlled, in part, by a PVT-control circuit.

As shown in FIG. 3, the 32 (i.e., $2^{N=5}$) different possible configurations of source block 210 correspond to 32 different effective block sizes, while the 32 different possible configurations of sink block 220 correspond to 25 different effective block sizes. (Note that other distributions of device sizes in sink block 220 could provide up to 32 different effective block sizes.) As described previously, an analogous prior-art output driver based on the architecture of FIG. 1 having N=5 identical sections in the source block and N=5 identical sections in the sink block could provide only (N+1)=6 different effective block sizes for each of the source and sink blocks.

According to certain embodiments of the present invention, PVT compensation for an integrated circuit is implemented such that the control of process and temperature (PT) compensation is independent of the control of voltage (V) compensation. For example, in one possible implementation in which a programmable device supports multiple I/O standards at the same time at different I/O positions around the device, a single PT-control circuit can be implemented for the entire device, with each bank of output drivers corresponding to a different I/O position having its own dedicated V-control circuitry.

Figure 4:
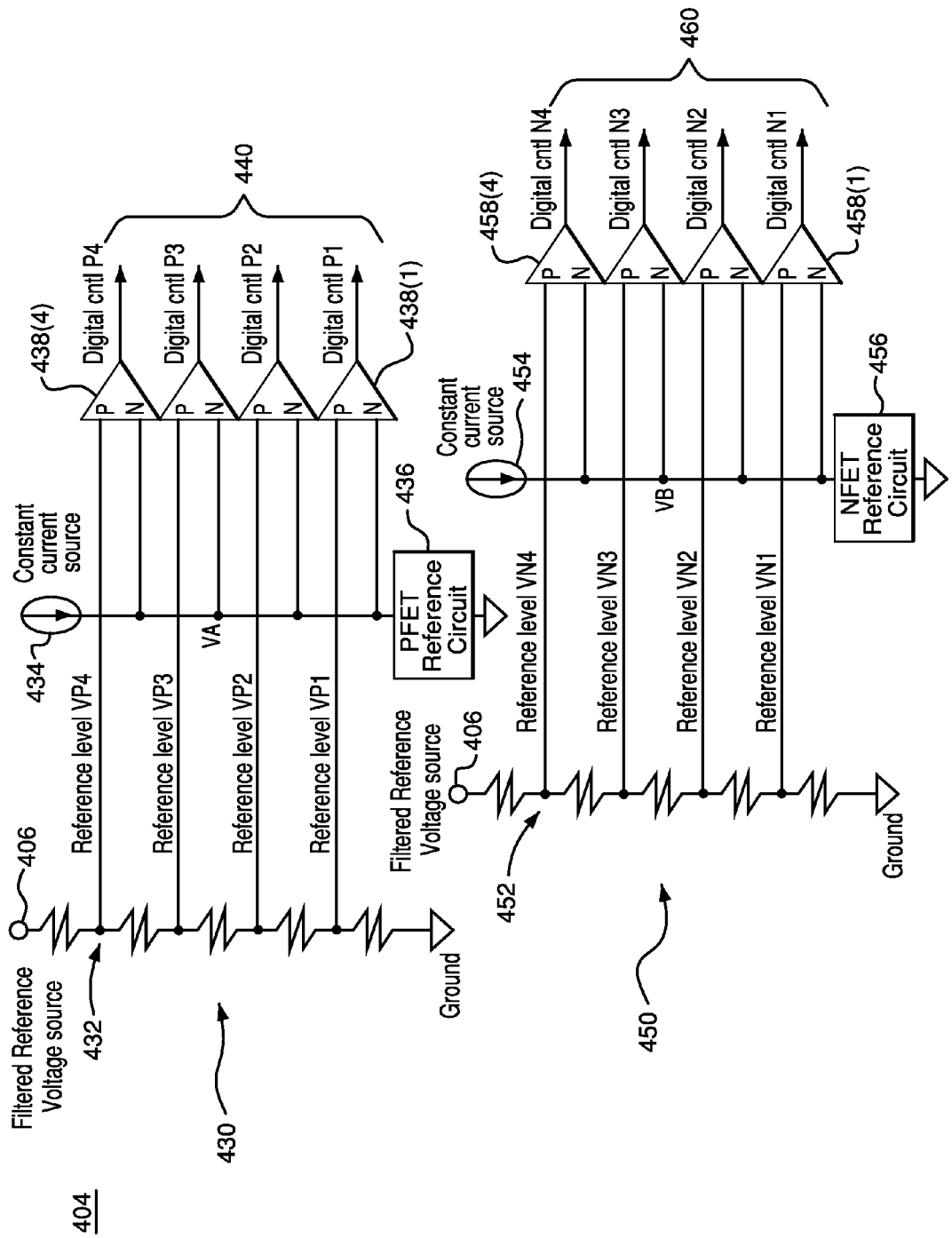
FIG. 4 shows a schematic block diagram of a PT-control circuit that can be used to compensate for process and temperature (PT) variations in an integrated circuit, such as the integrated circuit of FIG. 2.

FIG. 4 shows a schematic block diagram of a PT-control circuit 404 that can be used to compensate for process and temperature (PT) variations in an integrated circuit, such as integrated circuit 200 of FIG. 2. PT-control circuit 404 is described more completely in U.S. Pat. No. 6,480,026, the teachings of which are incorporated herein by reference. As shown in FIG. 2, PT-control circuit 404 has two sub-circuits: (i) source sub-circuit 430 for PT-control of PFET-based source circuitry such as source block 210 of FIG. 2 and (ii) sink sub-circuit 450 for PT-control of NFET-based sink circuitry such as sink block 220 of FIG. 2.

Each sub-circuit, operating at PT reference voltage 406, generates a four-bit digital control signal indicative of the process and temperature conditions within the integrated circuit. In particular, source sub-circuit 430 generates four-bit source PT-control signal 440=[P1, P2, P3, P4], and sink sub-circuit 450 generates four-bit sink PT-control signal 460=[N1, N2, N3, N4].

Source sub-circuit 430 compares (i) the voltage generated at source node VA by passing the source current from constant current source 434 through the impedance of PFET-based reference circuit 436 (which is sensitive to process and temperature variations) with (ii) each of the four different analog reference voltage levels VP1-VP4 generated by source resistance ladder 432. The output from comparator 438(1) indicates whether the voltage at source node VA is greater than (e.g., comparator output value "1") or less than (e.g., comparator output value "0") the first source reference voltage level VP1. Similarly, the output from comparator 438(2) indicates whether the voltage at source node VA is greater than or less than the second source reference voltage level VP2, which is greater than the first reference voltage level VP1, and so on for the third and fourth comparators 438(3) and 438(4).

As such, there are five possible values for the four bits [P1, P2, P3, P4] of source PT-control signal 440, i.e., [0000], [1000], [1100], [1110], [1111], representing five different PT states of source sub-circuit 430, where [0000] corresponds to the lowest voltages at source node VA, and [1111] corresponds to the highest voltages at source node VA.

Similarly, sink sub-circuit 450 compares (i) the voltage generated at sink node VB by passing the sink current from constant current source 454 through the impedance of NFET reference circuit 456 (which is sensitive to process and temperature variations) with (ii) each of the four different analog reference voltage levels VN1-VN4 generated by sink resistance ladder 452. The output from comparator 458(1) indicates whether the voltage at sink node VB is greater than (e.g., comparator output value "1") or less than (e.g., comparator output value "0") the first sink reference voltage level VN1. Similarly, the output from comparator 458(2) indicates whether the voltage at sink node VB is greater than or less than the second sink reference voltage level VN2, which is greater than the first reference voltage level VN1, and so on for the third and fourth comparators 458(3) and 458(4). As such, there are five possible values for the four bits [N1, N2, N3, N4] of sink PT-control signal 460, i.e., [0000], [1000], [1100], [1110], [1111], representing five different PT states of sink sub-circuit 450, where [0000] corresponds to the lowest voltages at sink node VB, and [1111] corresponds to the highest voltages at sink node VB.

Different implementations may generate different numbers of source/sink control signal bits for different levels of precision of PT control.

In one particular embodiment of the present invention, there is only one instance of PT-control circuit 404 of FIG. 4 in the integrated circuit. (In other embodiments, an integrated circuit can have two or more different instances of PT-control circuit 404, for example, where different regions of the integrated circuit can have significantly different operating temperatures.) In this particular embodiment, the integrated circuit has a number of different I/O positions around the device, where each different I/O position can be independently configured to one of a number of different possible I/O standards. In such an embodiment, each I/O position can be implemented with the capability of selecting from a set of available voltages for power supply VCCIO as well as selecting from a set of available drive strengths. For example, in one possible implementation, each I/O position can be configured to select (i) one of the following five different voltages for power supply VCCIO of 1.2V, 1.5V, 1.8V, 2.5V, and 3.3V as well as (ii) one of the following five different drive strengths of 1×, 2×, 3×, 4×, and 5×. Note that the one or more PT-control circuits will be driven by one or more different power supply voltages which can, but do not necessarily have to, differ from the power supply voltages selected to drive the various output drivers in the different I/O positions around the chip.

Although this discussion refers to different specific voltage levels, it will be understood that each available power supply voltage may correspond to a range of acceptable voltage levels. For example, the 1.2V power supply voltage may actually correspond to an acceptable voltage range, such as 1.2V±0.1V.

Figure 5:
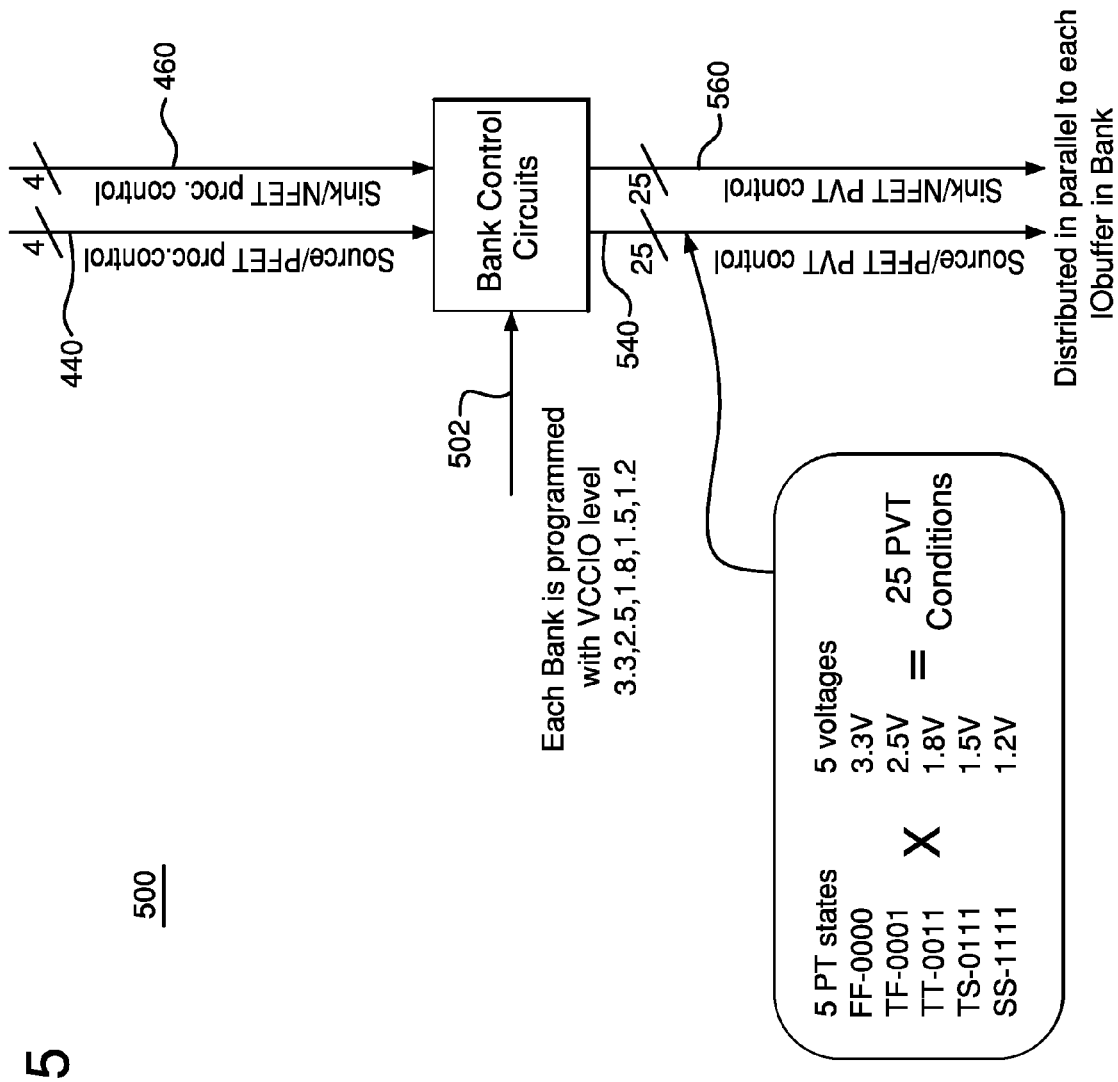
FIG. 5 shows a block diagram of a bank-control circuit implemented for each bank of output drivers in an integrated circuit, such as the integrated circuit of FIG. 2, where all of the output drivers in a bank are configured to operate at the same power supply voltage.

FIG. 5 shows a block diagram of bank-control circuit 500 implemented for each bank of output drivers in an integrated circuit, such as integrated circuit 200 of FIG. 2, where all of the output drivers in a bank are configured to operate at the same power supply voltage. As shown in FIG. 5, bank-control circuit 500 receives the four-bit source PT-control signal 440 and the four-bit sink PT-control signal 460 from PT-control circuit 404 of FIG. 4 as well as a signal 502 indicating the user-selected power supply voltage.

Bank control circuit 500 expands those inputs to generate (i) a 25-bit source PVT-control signal 540, where each bit corresponds to a different one of 25 different source PVT states (i.e., one bit for each different combination of (a) the five possible source PT states represented by the 4-bit source PT-control signal 440 and (b) the five possible power supply voltages), and (ii) a 25-bit sink PVT-control signal 560, where each bit corresponds to a different one of 25 different sink PVT states (i.e., one bit for each different combination of (a) the five possible sink PT states represented by the 4-bit sink PT-control signal 460 and (b) the five possible power supply voltages). Since only one of the 25 different source PVT states exists at a given time, one bit of the 25-bit source PVT-control signal 540 is high (e.g., logic 1), while the other 24 bits are low (e.g., logic 0). Similarly, since only one of the 25 different sink PVT states exists at a given time, one bit of the 25-bit sink PVT-control signal 560 is high, while the other 24 bits are low. Note that the particular bit that is high in source PVT-control signal 540 may have a different bit position from that of the bit that is high in sink PVT-control signal 560.

The 25-bit source and sink PVT-control signals 540 and 560 are distributed in parallel to each I/O driver in the bank.

Figure 6:
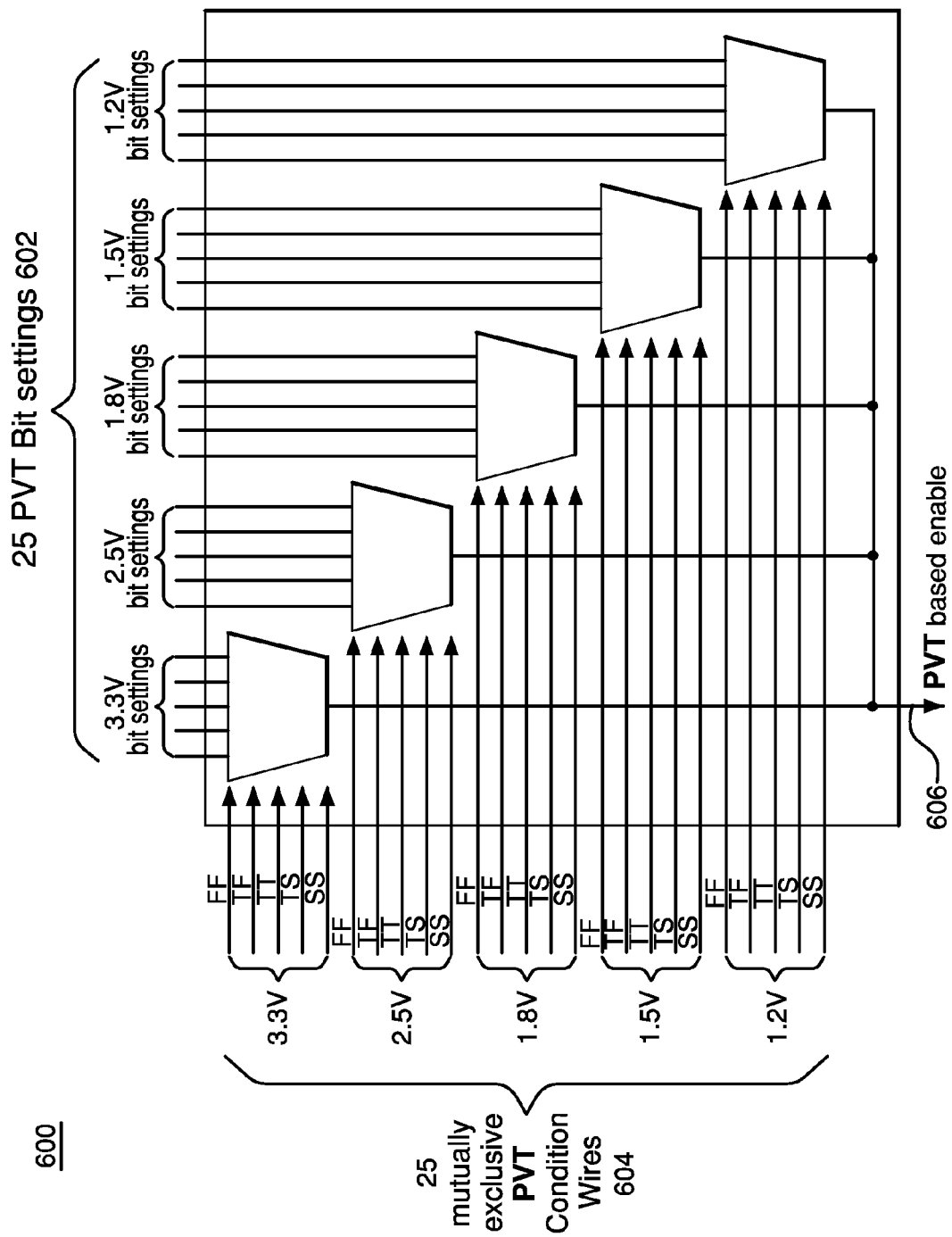
FIG. 6 shows a schematic block diagram of a PVT-control block.

FIG. 6 shows a schematic block diagram of PVT-control block 600. Each I/O driver has one instance of PVT-control block 600 for each available drive strength of each source/sink section of each source/sink block. For example, for an implementation having five source and five sink sections and five different available drive strengths, output driver 202 of FIG. 2 would have 50 instances of PVT-control block 600.

PVT-control block 600 is essentially a 25-to-1 multiplexer (mux) that receives a 25-bit input signal 602 and a 25-bit control signal 604 (having one high bit and 24 low bits) and outputs a 1-bit output signal 606 corresponding to the value of the bit of input signal 602 selected by the one high bit in control signal 604.

Each instance of PVT-control block 600 corresponds to a particular drive strength and a particular source/sink section. For the particular drive strength, the particular source/sink section will be either switched on or off depending on the current PVT state. Off-line testing or computer-based simulations may be performed to determine whether the particular source/sink section should be turned on or off for the particular drive strength for each of the 25 different possible PVT states in this implementation of integrated circuit 200 of FIG. 2. The results of that off-line processing are represented by the 25 different PVT bit settings in input signal 602. Depending on the particular implementation, those bit settings can be mask- or field-programmed into IC 200, e.g., using one-time programmable or re-programmable memory cells.

The current PVT state is represented by 25-bit control signal 604, which is either (a) 25-bit source PVT-control signal 540 from bank-control circuit 500 of FIG. 5 if the particular instance of PVT-control block 600 is used to control a source section 212 of output driver 202 of FIG. 2 or (b) 25-bit sink PVT-control signal 560 from bank-control circuit 500 if the particular instance of PVT-control block 600 is used to control a sink section 222 of output driver 202.

One-bit output signal 606 is used to control whether the corresponding source/sink section in output driver 202 is on (e.g., output signal 606 high) or off (e.g., output signal 606 low) for the particular drive strength.

Figure 7:
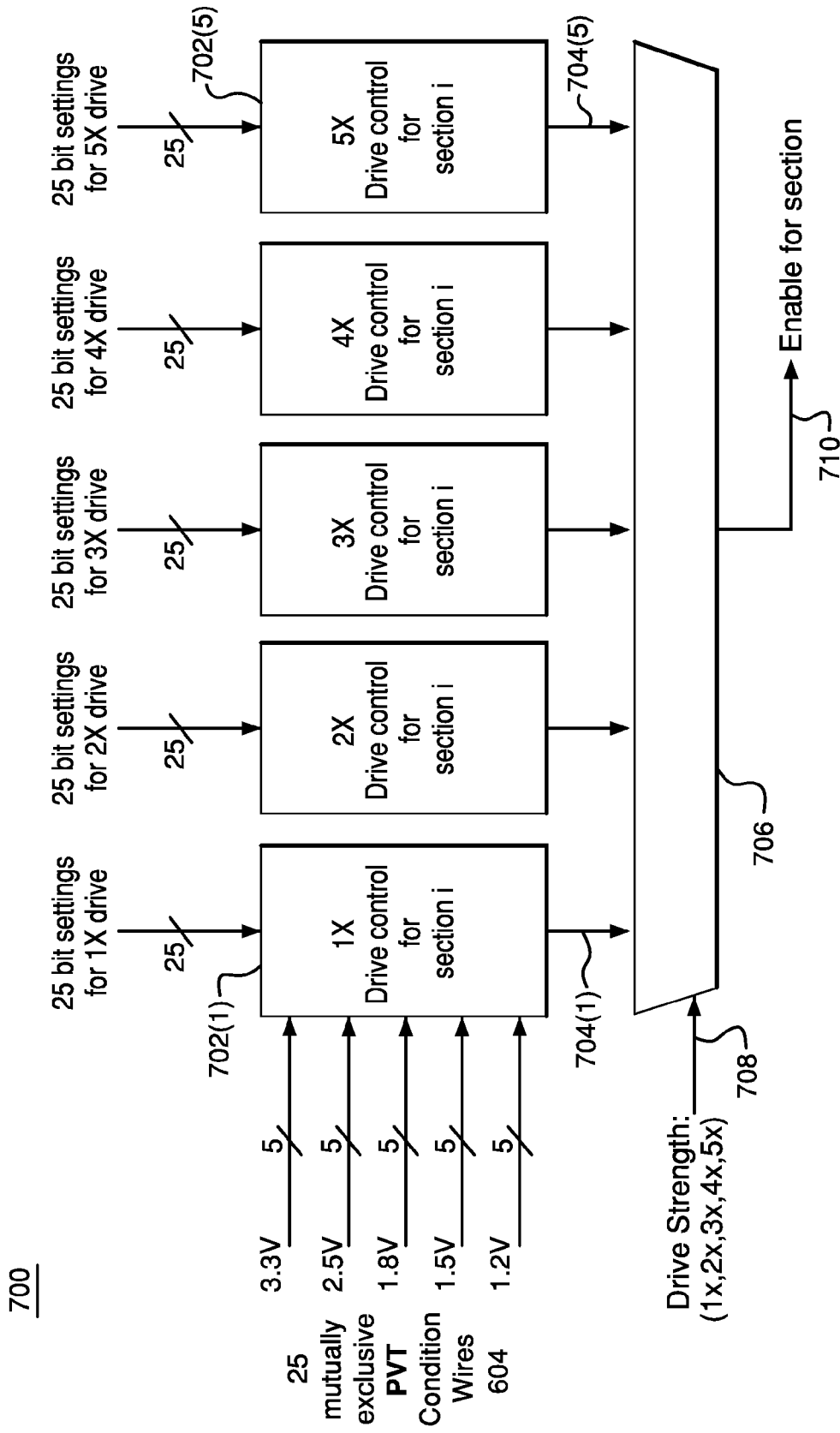
FIG. 7 shows a schematic block diagram of a section-control block.

FIG. 7 shows a schematic block diagram of section-control block 700. Output driver 202 of FIG. 2 has 10 instances of section-control block 700: one for each of source sections 212 and sink sections 222. As represented in FIG. 7, section-control block 700 has five instances 702(1)-702(5) of PVT-control block 600 of FIG. 6, corresponding to drive strengths 1×, 2×, 3×, 4×, and 5×, respectively, each generating a different one-bit output signal 704(i) corresponding to one-bit output signal 606 of FIG. 6. Section-control block 700 also has 5-to-1 mux 706, which receives and selects one of the five one-bit output signals 704(1)-704(5) based on drive-strength control signal 708 to output as section-control signal 710, which controls whether the corresponding source/sink section in output driver 202 is turned on or off for the selected drive strength and current PVT state.

Figure 8:
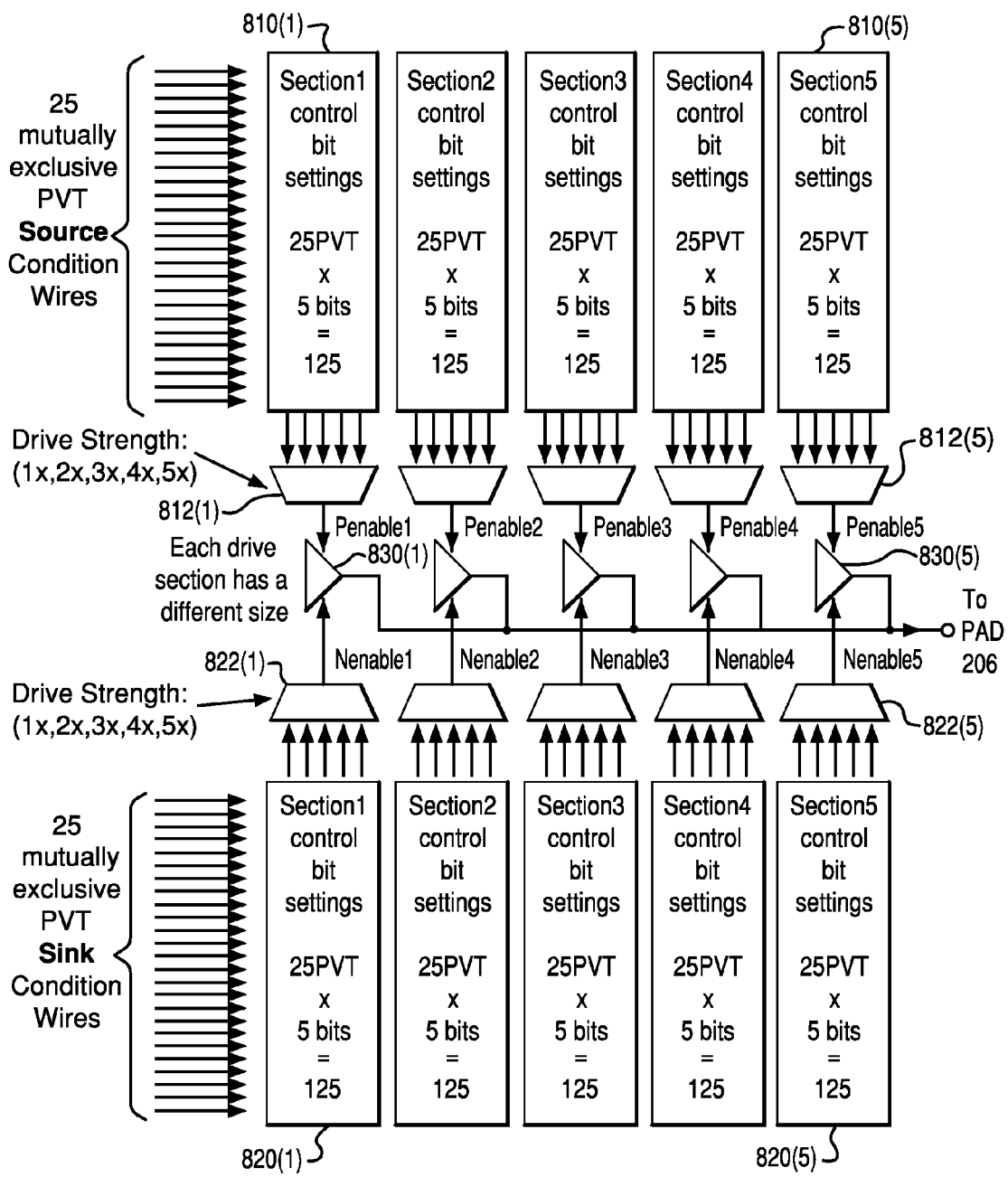
FIG. 8 shows a schematic block diagram representing the output driver of FIG. 2 with its corresponding source and sink section-control blocks and source and sink muxes, where each source/sink section-control block and corresponding source/sink mux is a different instance of the section-control block of FIG. 7.

FIG. 8 shows a schematic block diagram representing output driver 202 of FIG. 2 with its corresponding source and sink section-control blocks 810(1)-810(5) and 820(1)-820(5) and source and sink muxes 812(1)-812(5) and 822(1)-822(5), where each source/sink section-control block and corresponding source/sink mux is a different instance of section-control block 700 of FIG. 7. In FIG. 8, each corresponding pair of source and sink sections 212(i) and 222(i) in FIG. 2 is represented by a corresponding drive section 830(i).

The PVT-control scheme of integrated circuit 200 provides increased flexibility for control over PVT control by separating the voltage compensation from the process and temperature compensation. The separate voltage compensation enables voltage compensation to be dependent on both the user-selected power supply voltage and the user-selected drive strength. In general, for integrated circuits having the output driver architecture of FIG. 8, an output driver having N source sections and N sink sections provides up to $2^N$ different effective source sizes for the source block and up to $2^N$ different effective sink sizes for the sink block. Furthermore, the integrated circuit enables the mapping of each of up to (P×Q×R) different combinations of P source PT states, Q power supply voltages, and R drive strengths to one of the $2^N$ different effective source block sizes as well as each of up to (P×Q×R) different combinations of P sink PT states, Q power supply voltages, and R drive strengths to one of the $2^N$ different effective sink block sizes.

In the particular implementation of output driver 202 described above having N=5 source sections, N=5 sink sections, P=5 different source PT states, P=5 different sink PT states, Q=5 different power supply voltages, and R=5 different drive strengths, there are up to 125 different source combinations of PT states, power supply voltages, and drive strengths that map to up to $2^{N=5}$=32 different effective source block sizes and up to an analogous 125 different sink combinations that map to up to 32 different effective sink block sizes, wherein the source and sink mappings can be made independent of each other. Because the PT source compensation is independent of the PT sink compensation and the source section drive strength is independent of the sink section drive strength, there are up to 625 different combinations of source control and another 625 different combinations of sink control to control the DC characteristics of output driver 202 as a function of process, temperature, and output drive strength settings.

Furthermore, based on the architecture of FIG. 8, an integrated circuit can be implemented with (i) a single PT-control circuit, analogous to PT-control circuit 404 of FIG. 4, for the entire chip, (ii) a single bank-control circuit, analogous to bank-control circuit 500 of FIG. 5, for each different I/O bank in the chip, providing independent power supply voltage selection for the corresponding I/O bank, and (iii) independent drive-strength selection for each different output driver, analogous to output driver 202 of FIG. 2, of each different I/O bank in the chip.

As described earlier, PT-control circuit 404 of FIG. 4 is operated at PT reference voltage 406. According to certain embodiments, the voltage control scheme described earlier controls operations of output driver 202 of FIG. 2 as a function of the selected power supply voltage, where the selected power supply voltage is independent of the PT reference voltage. The term "independent" does not mean that the selected power supply voltage has to be different from the PT reference voltage. Rather, the term "independent" means that the selected power supply voltage is allowed to be different from the PT reference voltage. In an integrated circuit having one PT-control circuit and multiple I/O banks, each of which can be independently configured to select any one of a plurality of different power supply voltages, the selected power supply voltage for each different I/O bank can be, but does not have to be, different from the PT reference voltage.

Although the present invention has been described in the context of output drivers having source and sink sections implemented using PFETs and NFETs, respectively, the invention can also be implemented using other types of devices, such as other types of transistors or resistors, either alone or in combination with PFETs and NFETs.

Although the present invention has been described in the context of PVT control over an output driver, such as output driver 202 of FIG. 2, the present invention can also be implemented in other contexts such as for PVT control of other types of application circuitry, such as terminators and resistors.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MP-GAs), simple programmable logic devices (SPLDs), and complex programmable logic devices (CPLDs).

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. An integrated circuit comprising:
   configurable application circuitry adapted to operate at any selected power supply voltage of a plurality of available power supply voltages;
   PT-control circuitry adapted to generate a PT-control signal indicative of variations in at least one of process and temperature, wherein the PT-control circuitry operates at a PT reference voltage; and
   application-control circuitry adapted to control configuration of the application circuitry based on the selected power supply voltage for the application circuitry and the PT-control signal, wherein the selected power supply voltage for the application circuitry is independent of the PT reference voltage,
   wherein:
      the PT-control signal is capable of having any one of a plurality of different values, wherein each value corresponds to a different PT state;
      the selected power-supply voltage is indicated by a voltage-selection signal capable of having any one of a plurality of different values, wherein each value corresponds to a different power supply voltage; and
      the application-control circuitry is adapted to treat the PT-control signal and the voltage-selection signal as mutually independent inputs in controlling the configuration of the application circuitry.

2. The invention of claim 1, wherein the integrated circuit comprises:
   a first plurality of instances of the application circuitry, wherein the selected power supply for each instance of the application circuitry is independent of the selected power supply for each other instance of the application circuitry in the first plurality;
   a single instance of the PT-control circuitry for the first plurality; and
   a different instance of at least a portion of the application-control circuitry for each instance of the application circuitry.

3. The invention of claim 2, wherein the integrated circuit has a single instance of the PT-control circuitry for all instances of the application circuitry in the integrated circuit.

4. The invention of claim 1, wherein the integrated circuit is an FPGA.

5. An integrated circuit comprising:
   configurable application circuitry adapted to operate at any selected power supply voltage of a plurality of available power supply voltages;
   PT-control circuitry adapted to generate a PT-control signal indicative of variations in at least one of process and temperature, wherein the PT-control circuitry operates at a PT reference voltage; and
   application-control circuitry adapted to control configuration of the application circuitry based on the selected power supply voltage for the application circuitry and the PT-control signal, wherein the selected power supply voltage for the application circuitry is independent of the PT reference voltage,
   wherein:
   the application circuitry is an output driver comprising:
      a source driver block having a plurality of switched source sections connected in parallel between the selected power supply voltage and an output pad;
      a sink driver block having a plurality of switched sink sections connected in parallel between the output pad and a ground potential;
   the PT-control circuitry is adapted to generate a source PT-control signal and a sink PT-control signal; and
   the application-control circuitry is adapted to:
      turn on or off each switched source section based on the source PT-control signal and a voltage-selection signal indicative of the selected power supply voltage; and
      turn on or off each switched sink section based on the sink PT-control signal and the voltage-selection signal.

6. The invention of claim 5, wherein:
   the output driver is adapted to operate at any selected drive strength of a plurality of available drive strengths; and
   the application-control circuitry is adapted to:
   turn on or off each switched source section based on the source PT-control signal, the voltage-selection signal, and the selected drive strength; and
   turn on or off each switched sink section based on the sink PT-control signal, the voltage-selection signal, and the selected drive strength.

7. The invention of claim 6, wherein the integrated circuit comprises:
   a first plurality of I/O banks, each I/O bank having one or more instances of the output driver and each I/O bank adapted to be independently configured at a selected power supply voltage;
   a single instance of the PT-control circuitry for the first plurality; and
   the application-control circuitry comprises:
   a single instance of bank-control circuitry for each I/O bank and that generates:
   a source PVT-control signal based on the source PT-control signal and the voltage-selection signal; and
   a sink PVT-control signal based on the sink PT-control signal and the voltage-selection signal; and
   a different instance of section-control circuitry for each section of each instance of the output driver, wherein:
   if the section is a source section, then the section-control circuitry turns on or off the source section based on the source PVT-control signal and the selected drive strength; and
   if the section is a sink section, then the section-control circuitry turns on or off the sink section based on the sink PVT-control signal and the selected drive strength.

8. The invention of claim 7, wherein the integrated circuit has a single instance of the PT-control circuitry for all I/O banks in the integrated circuit.

9. An integrated circuit comprising:
   configurable application circuitry adapted to operate at any selected power supply voltage of a plurality of available power supply voltages;
   PT-control circuitry adapted to generate a PT-control signal indicative of variations in at least one of process and temperature, wherein the PT-control circuitry operates at a PT reference voltage; and application-control circuitry adapted to control configuration of the application circuitry based on the selected power supply voltage for the application circuitry and the PT-control signal, wherein the selected power supply voltage for the application circuitry is independent of the PT reference voltage, wherein:

the selected power-supply voltage is indicated by a voltage-selection signal capable of having any one of a plurality of different values, wherein each value corresponds to a different power supply voltage; and the application-control circuitry is adapted to treat the PT-control signal and the voltage-selection signal as mutually independent inputs in controlling the configuration of the application circuitry.

10. The invention of claim 9, wherein the integrated circuit comprises:

a first plurality of instances of the application circuitry, wherein the selected power supply for each instance of the application circuitry is independent of the selected power supply for each other instance of the application circuitry in the first plurality;

a single instance of the PT-control circuitry for the first plurality; and a different instance of at least a portion of the application-control circuitry for each instance of the application circuitry.

11. The invention of claim 10, wherein the integrated circuit has a single instance of the PT-control circuitry for all instances of the application circuitry in the integrated circuit.

12. The invention of claim 9, wherein the integrated circuit is an FPGA.

* * * * *